United States Patent
Watanabe (10) Patent No.: US 7,896,052 B2
(45) Date of Patent: Mar. 1, 2011

(54) BONDING APPARATUS AND BONDING METHOD

(75) Inventor: Shinjiro Watanabe, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 1026 days.

(21) Appl. No.: 11/603,039

(22) Filed: Nov. 22, 2006

(65) Prior Publication Data

US 2007/0119535 A1    May 31, 2007

(30) Foreign Application Priority Data

Nov. 25, 2005 (JP) .............................. 2005-340891

(51) Int. Cl.
B32B 37/00 (2006.01)
(52) U.S. Cl. .................. 156/580.2; 156/580.1
(58) Field of Classification Search ............... 156/73.1, 156/580.1, 580.2, 581; 264/442, 443, 445; 425/174.2
See application file for complete search history.

(56) References Cited

U.S. PATENT DOCUMENTS 3,562,822 A * 2/1971 Fesh .......................... 52/245
4,726,480 A * 2/1988 Hagan ....................... 215/232

FOREIGN PATENT DOCUMENTS

| JP | 6-36852 | 2/1994 |
|---|---|---|
| JP | 8-309562 | 11/1996 |
| JP | 2000-79486 | 3/2000 |
| JP | 2004-077242 | 3/2004 |
| JP | 2004-142136 | 5/2004 |
| KR | 100220109 B | 9/1999 |
| KR | 20040031595 | 4/2004 |

* cited by examiner

Primary Examiner—James Sells
(74) Attorney, Agent, or Firm—Finnegan, Henderson, Farabow, Garrett & Dunner, LLP (57) ABSTRACT

The present invention is a bonding apparatus which bonds a first object to be bonded and a second object to be bonded by bringing a bonding member into contact with an upper surface of the second object to be bonded placed on an upper surface of the first object to be bonded and ultrasonically vibrating the second object to be bonded by the bonding member, and the bonding member includes: a contact portion brought into contact with the second object to be bonded; and a holding portion holding the second object to bonded. With this structure, it is possible to prevent the object to bonded from sliding sideways to thereby properly bond the objects to be bonded to each other, even with a low pressing force.

7 Claims, 8 Drawing Sheets

BONDING APPARATUS AND BONDING METHOD

BACKGROUND OF THE INVENTION

1. Field of the Invention

The present invention relates to a bonding apparatus and a bonding method for bonding objects to be bonded by utilizing ultrasonic vibration.

2. Description of the Related Art

To inspect electric characteristics of electronic circuits such as IC and LSI formed on, for example, a semiconductor wafer, a probe card attached to a probe device is used. The probe card generally has a circuit board and a contactor. On a lower surface of the contactor facing the wafer, a large number of probe pins are supported via connection terminals, and to inspect the electric characteristics of the wafer, these large number of probe pins are brought into contact with electrodes of the electronic circuits (see Japanese Patent Application Laid-open No. 2004-77242).

Figure 12:
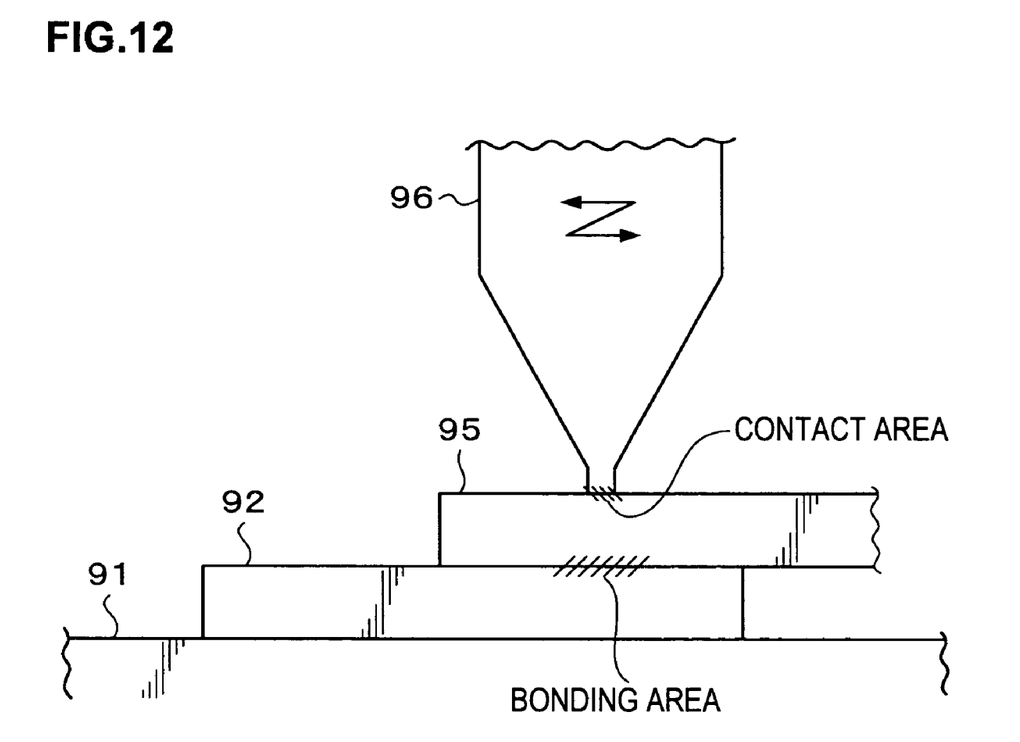
FIG. 12 is an explanatory view showing how a probe pin is bonded to a connection terminal by a conventional bonding member.

As an apparatus for bonding small components such as these probe pins and connection terminals, an apparatus performing ultrasonic bonding is known. This bonding apparatus includes a bonding member brought into contact with the probe pin and an ultrasonic vibrator giving ultrasonic vibration to the bonding member. To bond the probe pin and the connection terminal, a circuit board 93 is placed so that connection terminals 92 provided on a contactor 91 face upward, a probe pin 95 is placed on the connection terminal 92, and the probe pin 95 is pressed from above by a tip portion of a bonding member 96 as shown in, for example, in FIG. 12. Then, the bonding member 96 is ultrasonically vibrated by the oscillation of an ultrasonic vibrator. Then, the ultrasonic vibration of the bonding member 96 is transmitted to the probe pin 95, so that the probe pin 95 and the connection terminal 92 rub each other, whereby frictional heat is generated between the probe pin 95 and the connection terminal 92. Consequently, the probe pin 95 can be welded to the connection terminal 92.

SUMMARY OF THE INVENTION

In the conventional bonding apparatus, the probe pin 95, when given vibration by the bonding member 96, easily slides sideways relative to the bonding member 96, and in this case, the vibration cannot be efficiently transmitted from the bonding member 96 to the probe pin 95. The probe pin 95 also easily slides sideways relative to the connection terminal 92, and in this case, the probe pin 95 cannot be bonded at a proper position. Accordingly, there arises a need to increase a pressing force of the bonding member 96, but in this case, the connection terminal 92 and the probe pin 95 are liable to be damaged due to deformation.

The present invention was made in view of the above, and an object thereof is to provide a bonding apparatus and a bonding method capable of preventing an object to be bonded from sliding sideways and properly bonding objects to be bonded even with a low pressing force.

The present invention to solve the above problem is a bonding apparatus which bonds a first object to be bonded and a second object to be bonded by bringing a bonding member into contact with an upper surface of the second object to be bonded placed on an upper surface of the first object to be bonded and ultrasonically vibrating the second object to be bonded by the bonding member, wherein the bonding member has a contact portion which is brought into contact with the second object to be bonded and a holding portion which holds the second object to be bonded.

The bonding member may have an unleveled portion engaged with an unleveled portion provided in the second object to be bonded, and the unleveled portion of the bonding member may constitute the contact portion and the holding portion.

The unleveled portion of the bonding member may be composed of a flat plane provided in a tip portion of the bonding member and a projecting portion projecting from the flat plane, and the flat plane may be the contact portion and the projecting portion may be the holding portion. The projecting portion may be provided on a center portion of the flat plane. Further the projecting portion may be provided in plurality.

The unleveled portion of the bonding member may be composed of a flat plane provided in a tip portion of the bonding member and a recessed portion provided in the flat plane, and the flat plane may be the contact portion and the recessed portion may be the holding portion. The recessed portion may be provided in a center portion of the flat plane. Further, the recessed portion may be provided in plurality.

Projection and recession of the unleveled portion of the bonding member may be arranged alternately along a vibration direction of the ultrasonic vibration of the bonding member. The first object to be bonded may be an electrode provided on a surface facing an inspection object, in a probe card inspecting an electric characteristic of the inspection object, and the second object to be bonded may be a probe pin brought into contact with the inspection object, in the probe card.

The present invention according to another aspect is a bonding method of bonding a first object to be bonded and a second object to be bonded by welding which utilizes ultrasonic vibration, the method including: placing the second object to be bonded on an upper surface of the first object to be bonded; pressing a contact portion provided in a bonding member onto the second object to be bonded while holding an upper surface of the second object to be bonded by a holding portion provided in the bonding member; and ultrasonically vibrating the bonding member to ultrasonically vibrate the second object to be bonded, thereby welding the first object to be bonded and the second object to be bonded.

The bonding member may be ultrasonically vibrated in a state where an unleveled portion provided in the bonding member is engaged with an unleveled portion provided in the second object to be bonded. The first object to be bonded may be an electrode provided on a surface facing an inspection object, in a probe card inspecting an electric characteristic of the inspection object, and the second object to be bonded may be a probe pin brought into contact with the inspection object, in the probe card.

According to the present invention, since the holding portion of the bonding member holds the second object to be bonded, it is possible to prevent the second object to be bonded from sliding sideways relative to the bonding member when the bonding member is vibrated. Accordingly, positional deviation of the second object to be bonded from the first object to be bonded can be prevented, which as a result can enhance accuracy of the bonding position at which the second object to be bonded is bonded to the first object to be bonded. Moreover, since the contact portion of the bonding member is brought into contact with the second object to be bonded, the vibration of the bonding member can be surely transmitted to the second object to be bonded. With a safe pressing force not damaging the first object to be bonded and the second object to be bonded, it is possible to prevent the positional deviation of the second object to be bonded, efficiently weld the second object to be bonded and the first object to be bonded to each other, and obtain a sufficient bonding force.

DETAILED DESCRIPTION OF THE INVENTION

Figure 1:
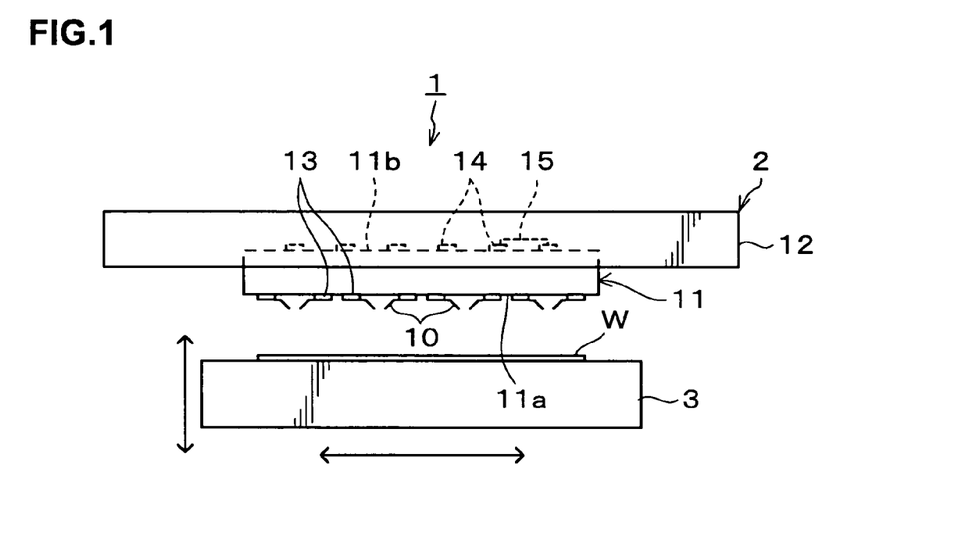
FIG. 1 is a side view schematically showing the structure of a probe device.

Hereinafter, preferred embodiments of the present invention will be described. FIG. 1 shows the structure of a probe device 1 including probe pins and connection terminals which are bonded by a bonding apparatus according to the present invention.

The probe device 1 includes, for example, a probe card 2 and a mounting table 3 to place thereon a wafer W as an inspection object. The probe card 2 includes: for example, a plurality of probe pins 10 brought into contact with electrodes of the wafer W; a contactor 11 supporting the plural probe pins 10 on a lower surface thereof; and a printed wiring board (circuit board) 12 for inspecting an electric characteristic of the wafer W. The contactor 11 and the printed wiring board 12 are formed in, for example, a substantially rectangular plate shape.

The contactor 11 has an outer surface (lower surface) 11a which faces the wafer W at the time of the inspection of the electric characteristic and a connection surface (upper surface) 11b which is attached to the printed wiring board 12. On the outer surface 11a, a plurality of connection terminals (electrodes) 13 are provided, and the probe pins 10 are bonded in one-to-one correspondence to the connection terminals 13. On the connection surface 11b, a plurality of contact terminals (electrodes) 14 connected to the printed wiring board 12, a capacitor 15, and so on are provided. The printed wiring board 12 is conductive to the contactor 11 via the contact terminals 14 so as to be capable of exchanging electric signals with the probe pins 10 via the contactor 11.

Figure 2:
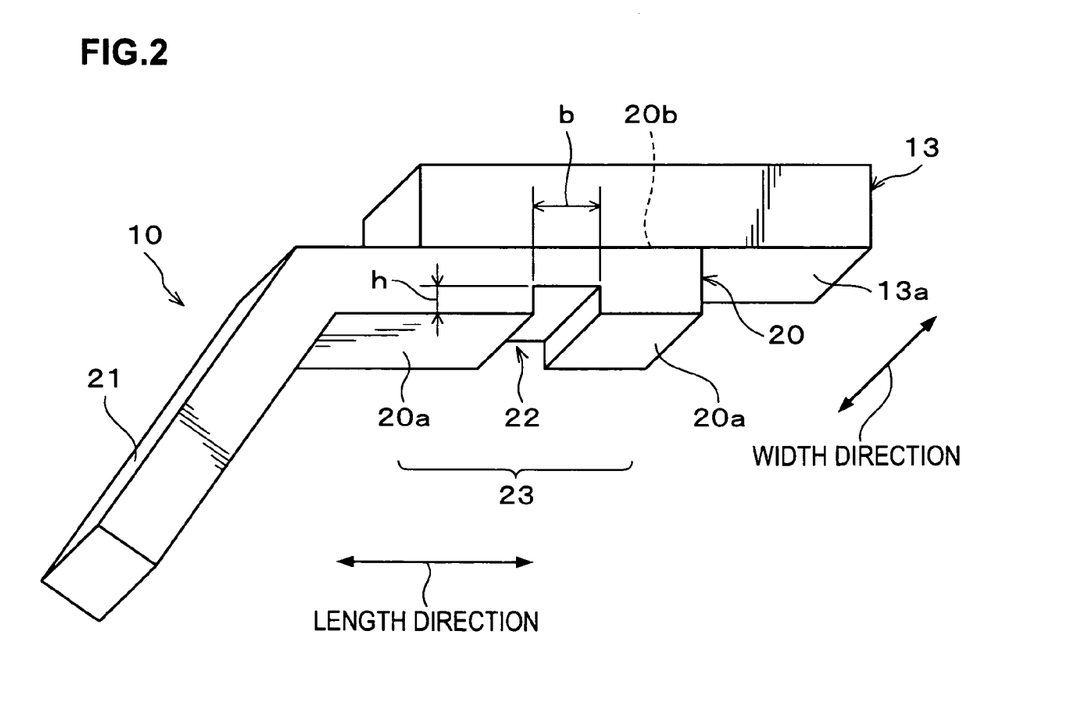
FIG. 2 is an enlarged perspective view showing the structure of a probe pin and a connection terminal.

Each of the probe pins 10 is made of a metal conductive material such as, for example, a nickel alloy, and as shown in FIG. 2, has a beam portion 20 having, for example, a slender and substantially rectangular parallelepiped shape and a tip portion 21 bent at a predetermined angle relative to the beam portion 20.

In a flat plane 20a which is a lower surface side of the beam portion 20 in FIG. 2, a recessed portion 22 is provided. The recessed portion 22 is provided in a slender slit form so as to extend from one (near-side) side surface to the other (far-side) side surface of the beam portion 20 along a width direction of the beam portion 20 (direction orthogonal to a length direction, a direction from the near side toward the far side in FIG. 2). The recessed portion 22 has a vertical cross section in a substantially quadrangular shape with a predetermined width (width in the length direction of the beam portion 20) b and a predetermined depth (level difference between the plane 20a and a bottom surface of the recessed portion 22) h. The recessed portion 22 formed as above and portions of the plane 20a positioned on both sides of the recessed portion 22 in the length direction of the beam portion 20 (that is, projecting portions relative to the recessed portion 22) form an unleveled portion 23, and the recessed portion 22 and these portions of the flat plane 20a as the projecting portions are arranged alternately in the length direction of the beam portion 20. Incidentally, inner side surfaces of the recessed portion 22 are set substantially vertical to a vibration direction D1 of later-described ultrasonic vibration and come into contact with side surfaces of a projecting portion 42 of a bonding member 31 when a later-described bonding apparatus 30 bonds the probe pin 10 and the connection terminal 13.

Each of the connection terminals 13 is made of a conductive material such as metal. Each of the probe pins 10 is supported in a state where a flat plane 20b, which is an upper surface side of the beam portion 20, is bonded to a plane 13a which is a lower surface side of the connection terminal 13, and the tip portion 21 is inclined downward. Further, the probe pins 10 are electrically connected to the printed wiring board 12 via the connection terminals 13 and the contactor 11.

To inspect electric characteristics of electronic circuits formed on the wafer W, the wafer W is placed on the mounting table 3 as shown in FIG. 1 and is lifted toward the contactor 11 side by the mounting table 3. Then, the electrodes of the wafer W are brought into contact with lower end portions of the tip portions 21 of the corresponding probe pins 10 respectively, and electric signals are exchanged with the wafer W via the printed wiring board 12, the contact terminals 14, the contactor 11, the connection terminals 13, and the probe pins 10. This makes it possible to inspect the electric characteristics of the electronic circuits on the wafer W.

Figure 3:
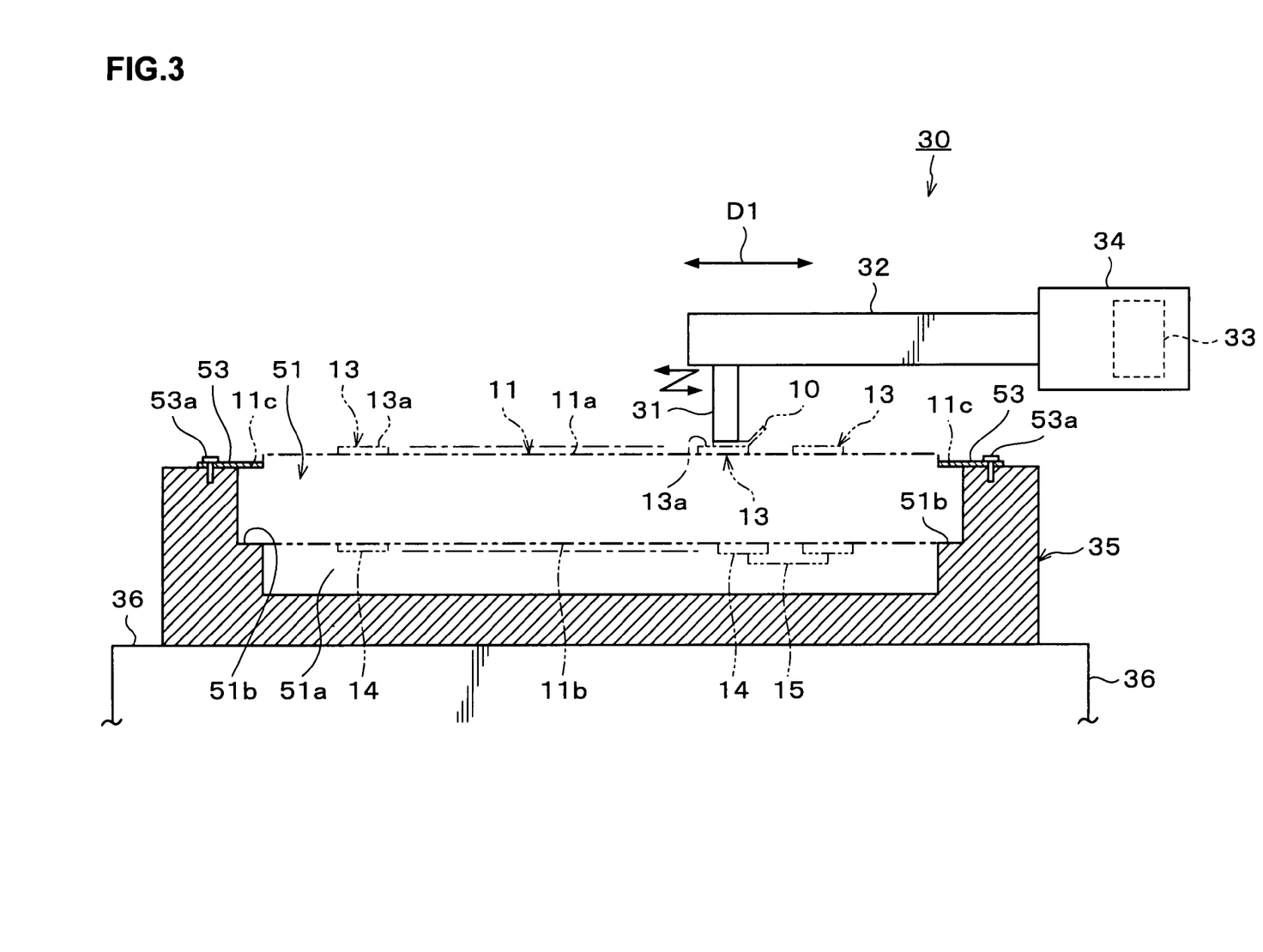
FIG. 3 is a side view schematically showing the structure of a bonding apparatus.

Next, the structure of the bonding apparatus 30 according to this embodiment will be described. FIG. 3 shows the bonding apparatus 30 for bonding the probe pin 10 as a second object to be bonded to the connection terminal 13 as a first object to be bonded. As shown in FIG. 3, the bonding apparatus 30 includes a bonding member (pressure bonder) 31, a holding mechanism 32 holding the bonding member 31, and a main body 34 having therein an ultrasonic vibrator 33 vibrating the bonding member 31. The bonding apparatus 30 further includes a holder 35 for holding the contactor 11, which has not been attached to the printed wiring board 12, under the bonding member 31, and a mounting table 36 on which the holder 35 is placed. Incidentally, a process of bonding the probe pins 10 to the connecting terminals 13 by the bonding apparatus 30 is performed before the contactor 11 is attached to the printed wiring board 12.

The holding mechanism 32 is supported by the main body 34 of the bonding apparatus 30 with its axial direction set lateral along a vibration direction (left and right direction in FIG. 3) D1. The bonding member 31 is attached to a tip portion of the holding member 32 with its tip portion directed downward. The ultrasonic vibrator 33 is provided on a base end side of the holding mechanism 32. By the vibration of the ultrasonic vibrator 33, the holding mechanism 32 is ultrasonically vibrated in the axial direction, so that the tip portion of the bonding member 31 is ultrasonically vibrated in the vibration direction D1.

Figure 4:
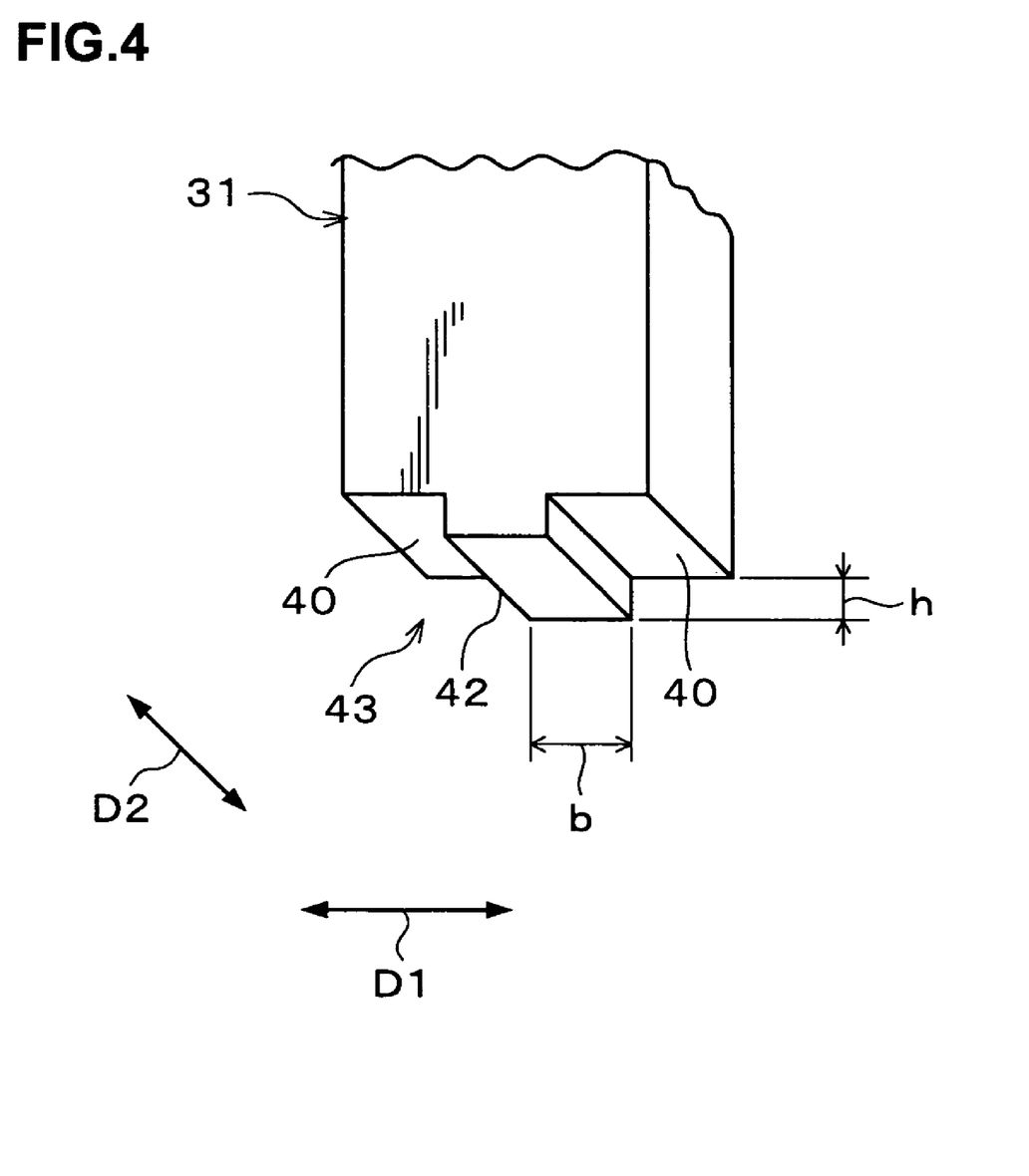
FIG. 4 is a perspective view showing a tip portion of the bonding member.

As shown in FIG. 4, in the tip portion of the bonding member 31, a flat plane 40 in a substantially quadrangular shape is disposed substantially horizontally. In a center portion of the flat plane 40 in the vibration direction D1, a projecting portion 42 is provided. The projecting portion 42 projects downward from the tip portion of the bonding member 31. Further, the projecting portion 42 is in a slender and substantially rectangular parallelepiped shape, and is provided to extend along a width direction D2 (a direction orthogonal to the vibration direction D1, a direction from a near side toward a far side in FIG. 4) from one (near-side) edge portion to the other (far-side) edge portion of the tip portion of the bonding member 31. The projecting portion 42 has a substantially quadrangular vertical cross section, with a predetermined width (width in the vibration direction D1) b and a predetermined level difference (level difference between the flat plane 40 and a lower surface of the projecting portion 42) h. The projecting portion 42 has side surfaces set substantially vertical to the vibration direction D1 of the bonding member 31, and when the probe pin 10 and the connection terminal 13 are bonded, the side surfaces of the projecting portion 42 come into contact with the side surfaces of the aforesaid recessed portion 22 provided in the probe pin 10. This structure makes it possible to efficiently transmit the ultrasonic vibration of the bonding member 31 to the probe pin 10 from the side surfaces of the projecting portion 42.

Figure 5:
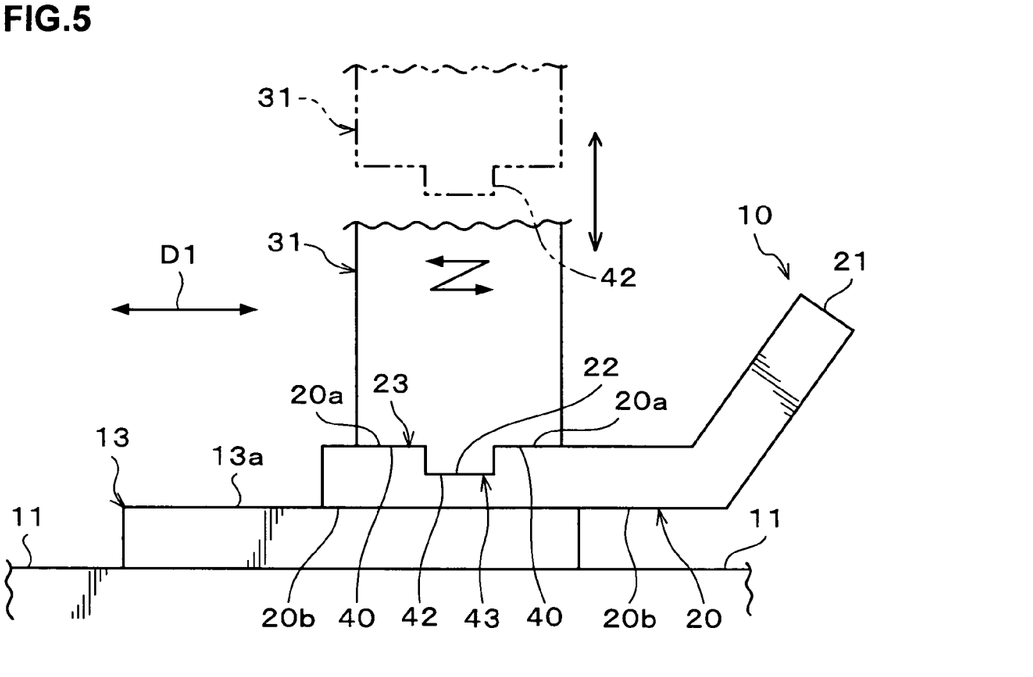
FIG. 5 is an explanatory view showing how the probe pin is bonded to the connection terminal.

The projecting portion 42 and portions of the flat plane 40 positioned on both sides of the projecting portion 42 (that is, two recessed portions relative to the projecting portion 42) form an unleveled portion 43. The unleveled portion 43 is formed such that the projecting portion 42 and these portions of the flat plane 40 as the recessed portions are arranged alternately in the vibration direction D1. Further, the unleveled portion 43 can be engaged with the unleveled portion 23 of the probe pin 10, and as shown in FIG. 5, the portions of the flat plane 40 on the both sides of the projecting portion 42 and the portions of the surface 20a on the both sides of the recessed portion 22 can be brought into close contact with each other in a state where the projecting portion 42 is inserted in the recessed portion 22. In this case, the projecting portion 42 functions mainly as a holding portion for stabilizing the holding of the probe pin 10, and the portions of the flat plane 40 on the both sides of the projecting portion 42 function mainly as contact portions which are brought into contact with the probe pin 10 in order to transmit the vibration of the bonding member 31 to the probe pin 10. That is, the portion functioning as the holding portion and the portions functioning as the contact portions are separately provided. Incidentally, the recessed portion 22 provided in the probe pin 10 functions as a held portion held by the projecting portion 42. Further, the portions of the plane 20a on the both sides of the recessed portion 22 function as contacted portions with which the portions of the flat plane 40 come into contact.

The holder 35 has a substantially rectangular tray shape, and in an upper surface thereof, a holding space 51 which is large enough to have a connection surface 11b-side portion of the contactor 11 inserted therein is formed. The holding space 51 includes an inner space 51a which is formed from the upper surface of the holder 35 down to a predetermined depth and in which the contact terminals 14, the capacitor 15, and so on are housed, and along an outer periphery of the inner space 51a, provided is a stepped portion 51b on which a peripheral edge portion of the connection surface 11b of the contactor 11 is placed. The contactor 11 is inserted in the holding space 51 in a state where the connection surface 11b side is faced downward, the contact terminals 14, the capacitor 15, and so on are housed in the inner space 51a, the peripheral edge portion of the connection surface 11b are in contact with an upper surface of the stepped portion 51b, the outer surface 11a is faced upward, and the connection terminals 13 are made to face the upper side of the contactor 11. In a state where the contactor 11 is thus held by the holder 35 and the holder 35 is placed on a substantially horizontal upper surface of the mounting table 36, the contactor 11 is held substantially horizontally. Further, plane 13a of the connection terminals 13 becomes substantially horizontal, and the plane 20a of the probe pin 10 placed on the plane 13a also becomes substantially horizontal. The contact terminals 14, the capacitor 15, and so on provided on the connection surface 11b side are protected since they are kept in the inner space 51a while being surrounded by the holder 51 in a non-contact state. Therefore, the contact terminals 14, the capacitor 15, and so on provided on the connection surface 11b side can be prevented from being damaged.

Further, a plurality of presser members 53 pressing the peripheral edge portion of the outer surface 11a of the contactor 11 inserted in the holding space 51 are attached to the holder 35. The presser members 53 are provided in such a manner that base end portions thereof are detachably attached to the upper surface of the holder 35 and tip portions thereof extend to an upper portion of the holding space 51. That is, the contactor 11 can be held while the outer surface 11a thereof is pressed from above by the tip portions of the presser members 53. Further, in the example in the drawing, in the peripheral edge portion of the outer surface 11a of the contactor 11, provided is a stepped portion 11c which is positioned lower than a center side of the outer surface 11a when the contactor 11 is attached to the holder 35, and the tip portions of the presser members 53 are arranged along an upper surface of the stepped portion 11c, so that the tips of the presser members 53 press a center-side side surface of the outer surface 11a from the outside. The base end portion of each of the presser members 53 is fixed to the upper surface of the holder 35 by, for example, screwing with a screw 53a. For example, one presser member 53 or more may be provided for each of four sides of the outer surface 11a of the contactor 11. This can ensure the holding of the contactor 11.

Next, a method of bonding the probe pin 10 to the connection terminal 13 by using the bonding apparatus 30 as structured above will be described. First, as shown in FIG. 3, the contactor 11 is inserted in the holding space 51 of the holder 35, and the presser members 53 are attached to hold the outer surface 11a of the contactor 11. When the contactor 11 is inserted in the holding space 51, the outer surface 11a of the contactor 11 is set upward, the peripheral edge portion of the connection surface 11b is placed on the stepped portion 51b, and the connection terminals 14, the capacitor 15, and so on are put in the inner space 51a. After the holder 35 thus holding the contactor 11 is fixed on the mounting table 36, the probe pin 10 is aligned with and placed on one of the connection terminals 13 attached to the contactor 11, as shown in FIG. 5. Specifically, the probe pin 10 is placed so that the plane 20b which is set as a lower surface of the beam portion 20 is in contact with the plane 13a which is set as an upper surface of the contact terminal 13.

After the beam portion 20 is placed on the contact terminal 13, the bonding member 31 is moved down from above the beam portion 20, so that the unleveled portion 43 of the bonding member 31 is moved, from above, closer to the unleveled portion 23 of the plane 20a which is set as the upper surface of the beam portion 20. At this time, the vibration direction D1 of the bonding member 31 matches the length direction of the beam portion 20, and the width direction D2 of the bonding member 31 matches the width direction of the beam portion 20. Then, the projecting portion 42 of the bonding member 31 is inserted from above in the recessed portion 22 of the beam portion 20. Consequently, the unleveled portion 23 and the unleveled portion 43 are engaged with each other, the portions of the flat plane 40 on the both sides of the projecting portion 42 are brought into close contact with the portions of the plane 20 on the both sides of the recessed portion 22, and the beam portion 20 is pressed from above by the bonding member 31.

In the state in which the unleveled portion 23 and the unleveled portion 43 are engaged with each other, the bonding member 31 is pressed onto the beam portion 20, and the plane 20b of the beam portion 20 and the plane 13a of the connection terminal 13 are in close contact with each other as described above, the ultrasonic vibrator 33 generates ultrasonic vibration, so that the bonding member 31 is ultrasonically vibrated in the vibration direction D1. The ultrasonic vibration of the ultrasonic vibrator 33 is transmitted to the beam portion 20 via the holding mechanism 32 and the bonding member 31. Accordingly, the probe pin 10 is vibrated in the vibration direction D1, so that the plane 20b of the beam portion 20 and the plane 13a of the connection terminal 13 rub each other. Due to this frictional heat, the planes 20b, 13a melt to be welded to each other. Especially because the side surfaces of the projecting portion 42 and the side surfaces of the recessed portion 22 are in close contact with each other and are substantially vertical to the vibration direction D1, the vibration of the bonding member 31 is effectively transmitted to the probe pin 10 from the side surfaces of the projecting portion 42. The probe pin 10 is thus given the ultrasonic vibration by the bonding member 31 to be thereby bonded to the connection terminal 13. Thereafter, the bonding member 31 is moved up from the probe pin 10, so that the projecting portion 42 is moved out from the recessed portion 22. In the above-described manner, the bonding by the bonding apparatus 30 is finished. The contactor 11 to which the probe pins 10 are thus bonded is carried out of the bonding apparatus 30 and thereafter is attached to the printed wiring board 12. Consequently, the probe card 2 is completed.

According to the above-described embodiment, the probe pin 10 is pressed by the bonding member 31 in the state where the unleveled portion 23 and the unleveled portion 43 provided in the probe pin 10 and the bonding member 31 respectively are engaged with each other, so that the probe pin 10 is surely held. Even if the vibration is given to the bonding member 31 and the probe pin 10, the projecting portion 42 does not come off the recessed portion 22 and continues to surely hold the recessed portion 22, so that it is possible to prevent the probe pin 10 from sliding sideways relative to the bonding member 31. Therefore, positional deviation of the probe pin 10 from the bonding member 31 and the connection terminal 13 can be prevented and the probe pin 10 can be bonded to the connection terminal 13 at a proper position with high accuracy. Especially because the recessed portions and the projecting portions are arranged in the bonding member 31 and the probe pin 10 in the vibration direction D1, it is possible to effectively prevent the bonding member 31 and the probe pin 10 from being displaced from each other in the vibration direction D1. Further, even if the probe pin 10 is vibrated while being pressed by the bonding member 31 with a lower pressing force, the positional deviation of the probe pin 10 can be surely prevented. That is, it is possible to safely bond the probe pin 10 with an appropriate pressing force not liable to damage the bonding member 31, the probe pin 10, and the connection terminal 13.

Further, since the probe pin 10 is prevented from sliding sideways relative to the bonding member 31, vibration energy of the bonding member 31 is surely transmitted to the probe pin 10 and is efficiently converted to frictional heat between the probe pin 10 and the connection terminal 13. This enables efficient bonding by the ultrasonic vibration.

Figure 6:
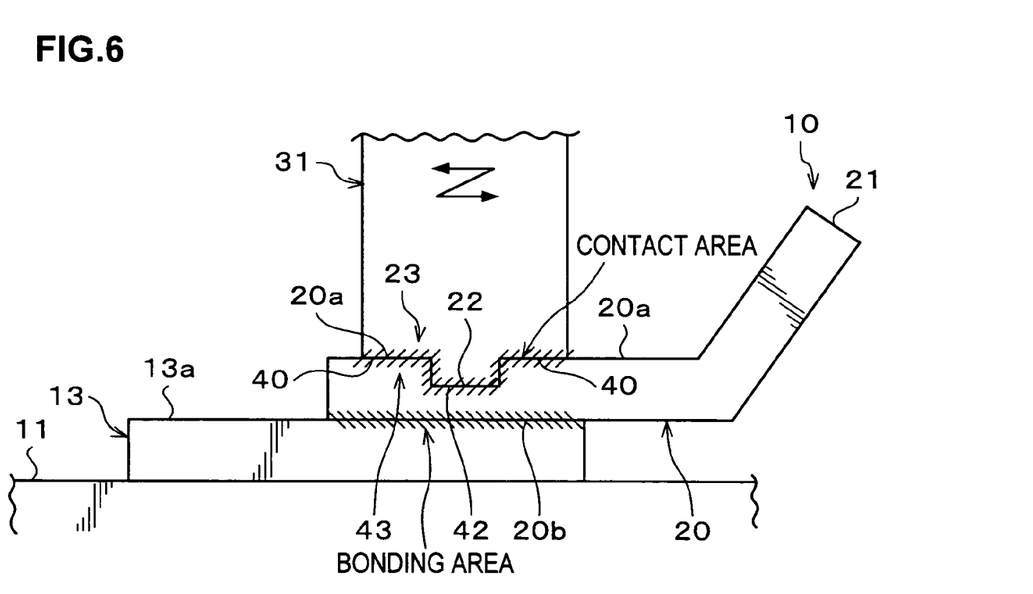
FIG. 6 is an explanatory view showing a contact area and a bonding area.

Moreover, owing to the structure such that the portions of the flat plane 40 on the both sides of the projecting portion 42 are pressed onto the portions of the plane 20a on the both sides of the recessed portion 22 while the recessed portion 22 is held by the projecting portion 42, it is possible to more stably hold the probe pin 10 and surely transmit the vibration of the bonding member 31 to the probe pin 10. Moreover, since a contact area with which the bonding member 31 and the probe pin 10 are in contact with each other (see FIG. 6) becomes wider than a contact area with which a bonding member of a conventional apparatus and a probe pin are in contact with each other (see FIG. 12), the pressing force is given to a wider range of the probe pin 10. In this case, since an area where the frictional heat necessary for welding is generated between the plane 20b and the plane 13a becomes wider, a bonding area bonded by welding becomes wide. Therefore, a bonding force between the plane 20b and the plane 13a increases, so that the probe pin 10 is firmly attached to the connection terminal 13.

In the above-described embodiment, the first object to be bonded is the connection terminal 13 and the second object to be bonded is the probe pin 10, but the first object to be bonded and the second object to be bonded are not limited to these. Further, the present invention is not limited to the bonding of the probe pin and the connection terminal of the probe card to each other, but is applicable to bonding of various electronic components and the like. For example, the present invention is applicable to a bonding apparatus of a semiconductor chip. That is, the first object to be bonded may be a connection electrode of the semiconductor chip and the second object to be bonded may be a bonding wire.

In the above-described embodiment, the bonding member 31 is ultrasonically vibrated in the vibration direction D1 which is a lateral direction, but the present invention is also suitably applicable to a case where the vibration direction is a vertical direction. That is, in a case where the probe pin 10 is ultrasonically vibrated in an up and down direction by the bonding member 31, it is also possible to surely prevent the positional deviation of the probe pin 10 by holding the probe pin 10 while the projecting portion 42 is inserted in the recessed portion 22.

Figure 7:
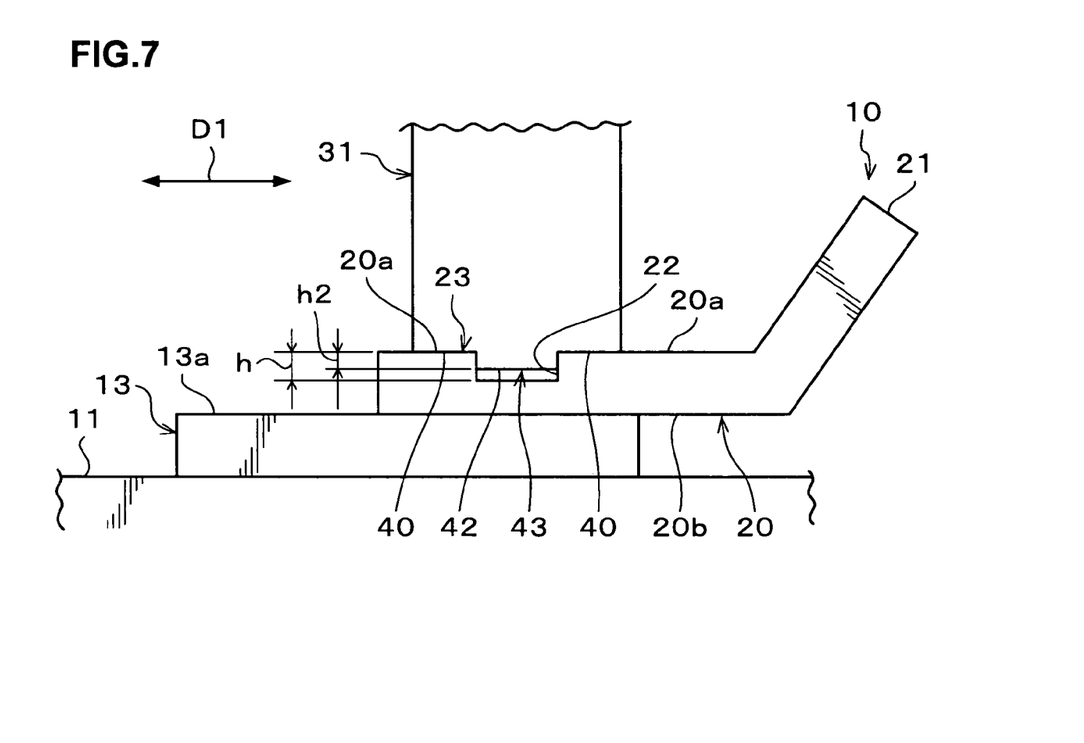
FIG. 7 is an explanatory view showing an embodiment in which a level difference of a projecting portion provided in the bonding member is made smaller than the depth of a recessed portion provided in the probe pin.

In the above-described embodiment, when the probe pin 10 and the connection terminal 13 are bonded to each other, the flat plane 40 which is a contact portion of the bonding member 31 and the plane 20 which is a contacted portion of the probe pin 10 are brought into contact with each other, but the projecting portion 42 as the holding portion and the recessed portion 22 as the held portion need not necessarily be in contact with each other. For example, as shown in FIG. 7, a level difference h' of the projecting portion 42 from the flat plane 40 may be smaller than a depth h of the recessed portion 22. In this structure, the flat plane 40 is brought into contact with the probe pin 10, with a gap being formed between a lower surface of the projecting portion 42 and a bottom surface of the recessed portion 22. In this structure, it is possible to surely bring the flat plane 40 into contact with the plane 20a and surely transmit the vibration of the bonding member 31 from the flat plane 40. Further, strict accuracy in machining the recessed portion 22 and the projecting portion 42 is not required, which facilitates the machining.

Figure 8:
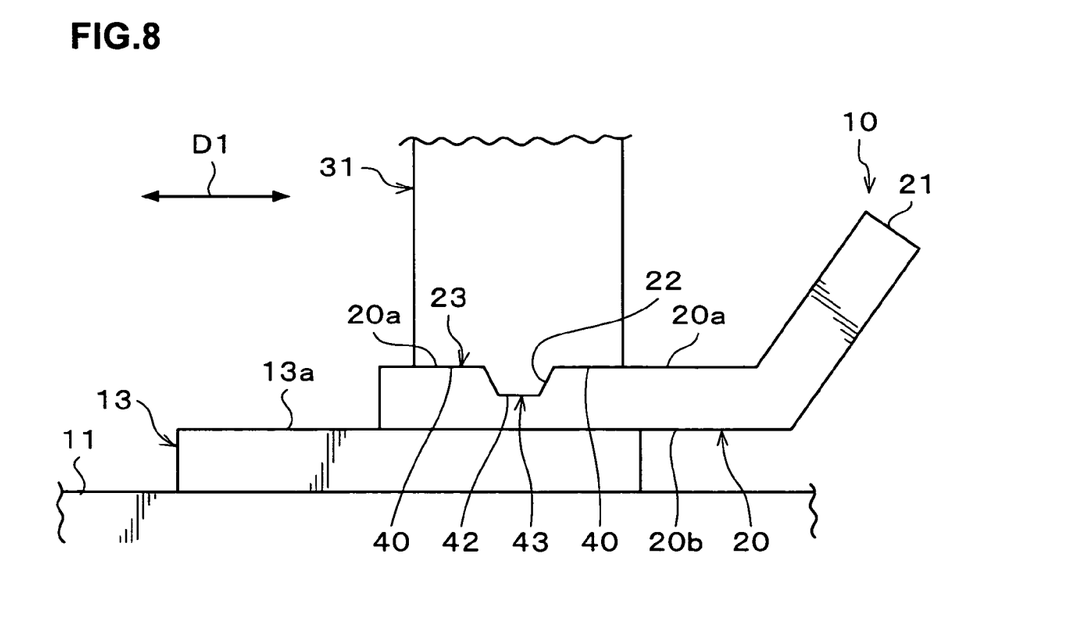
FIG. 8 is an explanatory view showing an embodiment in which a projecting portion provided in the bonding member has a substantially trapezoidal cross section.

Further, the shapes of the recessed portion 22, the projecting portion 42, and so on are not limited to those shown in the above-described embodiment. For example, the side surfaces of the projecting portion 42 and the side surfaces of the recessed portion 22 are described as planes substantially vertical to the vibration direction D1, but for example, as shown in FIG. 8, the projecting portion 42 and the recessed portion 22 may be in a shape having a substantially trapezoidal vertical cross section whose width in the vibration direction D1 becomes narrower toward a lower side, and the side surfaces of the projecting portion 42 and the side surfaces of the recessed portion 22 may be inclined relative to the vibration direction D1. In this case, when the projecting portion 42 is inserted to and moved out from the recessed portion 22, the occurrence of friction between an outer surface of the projecting portion 42 and an inner surface of the recessed portion 22 can be prevented, which is advantageous in that the projecting portion 42 can be easily and smoothly inserted to and moved out from the recessed portion 22.

In the above-described embodiment, the unleveled portion 43 is composed of the one projecting portion 42 and the portions of the flat plane 40 on the both sides of the projecting portion 42 (that is, two recessed portions), and the unleveled portion 23 is composed of the one recessed portion 22 and the portions of the plane 20a on the both sides of the projecting portion 22 (that is, two projecting portions), and thus the recessed portions and the projecting portions in totally three pairs are engaged with each other, but the numbers of the recessed portions and the projecting portions included in each of the unleveled portions 43, 23 are not limited to these numbers, but the recessed portions and projecting portions in four pairs or more may be engaged with each other. A possible example is that a plurality of the projecting portions 42 are arranged in the vibration direction D1 on the flat plane 40, and these projecting portions 42 is inserted in one-to-one correspondence into the plural recessed portions 22 arranged in the length direction in the plane 20a.

Figure 9:
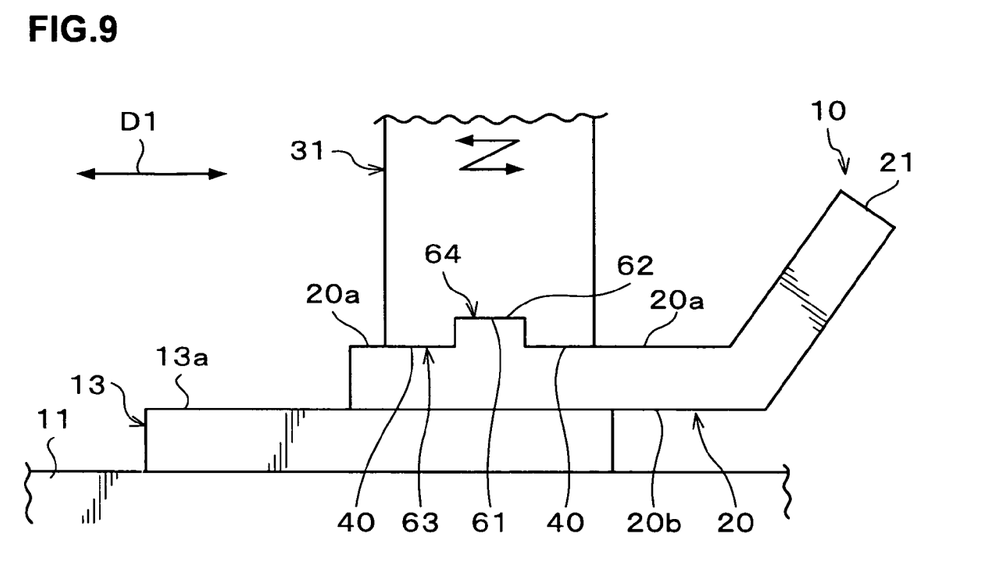
FIG. 9 is an explanatory view showing an embodiment in which a recessed portion as a holding portion is provided in the bonding member, and a projecting portion as a held portion is provided in the probe pin.

Further, the above embodiment has described the case where the projecting portion 42 is provided on the flat plane 40 of the bonding member 31 and the recessed portion 22 is provided in the flat plane 20a of the probe pin 10, but another possible structure is such that, for example, as shown in FIG. 9, a recessed portion 61 recessed upward from the flat plane 40 of the bonding member 31 is provided in the center portion of the flat plane 40 and a projecting portion 62 projecting upward from the plane 20a of the probe pin 10 is provided in the plane 20a. In such a form, the recessed portion 61 provided in the center portion and portions of the flat plane 40 provided on both sides of the recessed portion 61 (that is, two projecting portions relative to the recessed portion 61) form an unleveled portion 63. Further, the projecting portion 62 provided in the center portion and portions of the plane 20a provided on both sides of the projecting portion 62 (that is, two recessed portions relative to the projecting portion 62) form an unleveled portion 64. The recessed portion 61 of the unleveled portion 63 functions as a holding portion, the projecting portion 62 functions as a held portion, the portions of the flat plane 40 on the both sides of the recessed portion 61 function as contact portions, and the portions of the plane 20a on the both sides of the projecting portion 62 function as contacted portions. At the time of bonding, the portions of the flat plane 40 on the both sides of the recessed portion 61 are brought into contact with the portions of the plane 20a on the both sides of the projecting portion 62, with the projecting portion 62 inserted in the recessed portion 61. In this case, by inserting the projecting portion 62 in the recessed portion 61, it is also possible to prevent the probe pin 10 from deviating from the bonding member 31, so that the probe pin 10 can be surely held.

Figure 10:
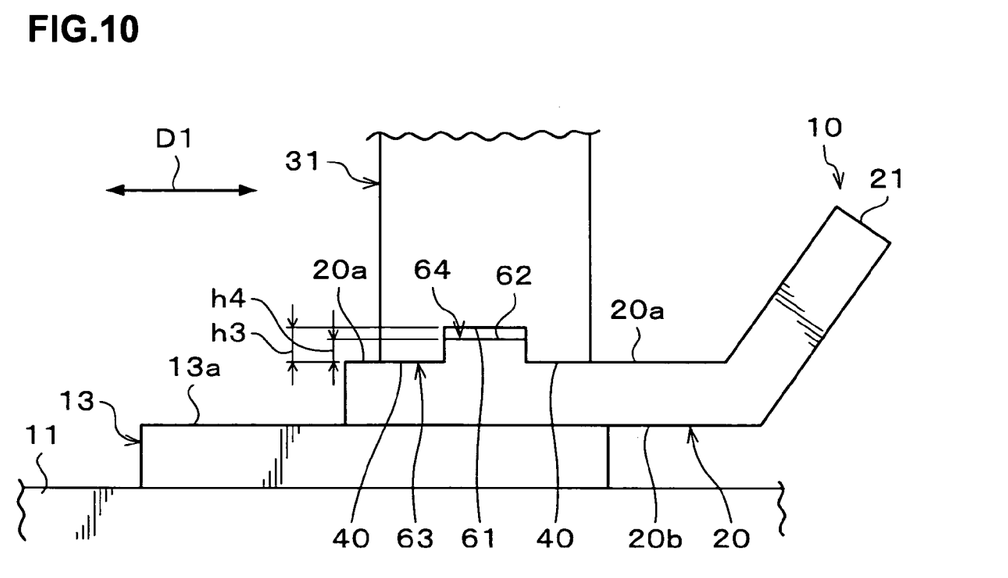
FIG. 10 is an explanatory view showing an embodiment in which the depth of a recessed portion provided in the bonding member is made larger than a level difference of a projecting portion provided in the probe pin.

A depth h3 of the recessed portion 61 (level difference between an upper surface of the recessed portion 61 and the flat plane 40) and a height h4 of the projecting portion 62 (level difference between an upper surface of the projecting portion 62 and the plane 20a) may be substantially equal to each other, but as shown in FIG. 10, the depth h3 may be larger than the height h4. That is, the flat plane 40 may be capable of coming into contact with the probe pin 10 in the state where an appropriate gap is formed between the upper surface of the projecting portion 62 and the upper surface of the recessed portion 61. This structure makes it possible to surely bring the flat plane 40 into contact with the plane 20a and accordingly to surely transmit the vibration of the bonding member 31 from the flat plane 40. Further, strict accuracy in machining the recessed portion 22 and the projecting portion 42 is not required, which facilitates the machining.

Hitherto, preferred embodiments of the present invention have been described with reference to the attached drawings, but the present invention is not limited to such examples. It is apparent that those skilled in the art could reach modified examples or corrected examples of various kinds within the range of the technical spirit described in the claims, and it should be understood that these modified examples and corrected examples are also included in the technical scope of the present invention.

The present inventors conducted the following experiments 1, 2 in order to compare a bonding force (a bonding force between the plane 20b and the plane 13a) when the bonding apparatus 30 described in the embodiment is used to bond the probe pin 10 and the connection terminal 13, with a bonding force when a conventional bonding apparatus is used to bond the probe pin 10 and the connection terminal 13.

Experiment 1

Figure 11:
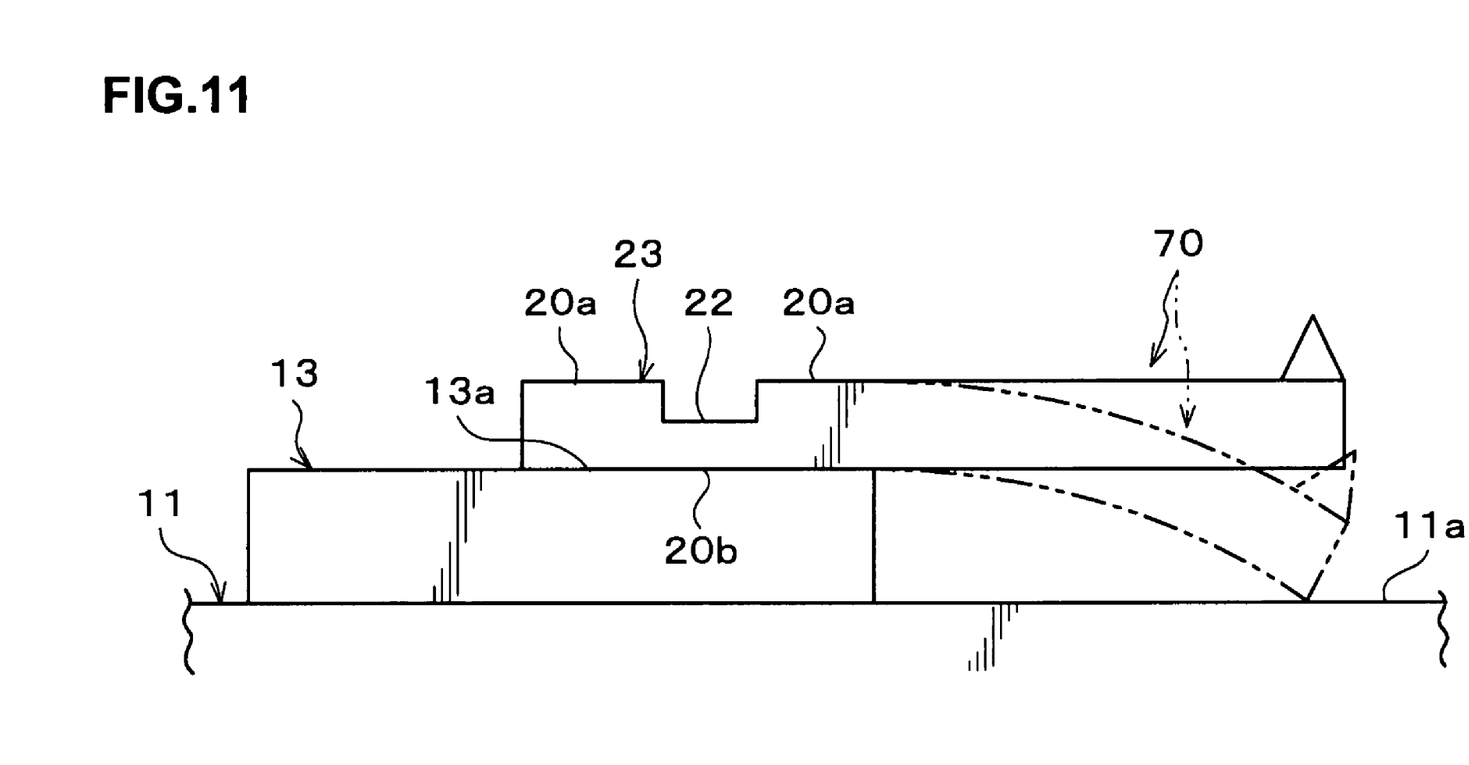
FIG. 11 is an explanatory view showing a positional relation of a connection terminal and a probe pin and a state in which the probe pin is deformed, in experiments 1, 2.

By using the bonding apparatus 30, 46 prototypes as shown in FIG. 11 were fabricated, each structured such that a probe pin 70 in a slender and substantially rectangular parallelepiped shape and a connection terminal 13 were bonded together. The probe pin 70 used in each of these prototypes includes, on a base end side, an unleveled portion 23 similar to that of the beam portion 20. A tip side of the probe pin 70 extends to the outside of the connection terminal 13 in a state where the base end side thereof is bonded to a plane 13a of the connection terminal 13. These prototypes were placed, with the probe pins 70 being positioned on an upper side of the connection terminals 13, and the tips of the probe pins 70 were pressed from above, whereby the probe pins 70 were bent. The probe pins 70 were pressed until lower portions of the tips of the probe pins 70 came into contact with an outer surface 11a of a contactor 11 positioned thereunder (state shown by the chain double-dashed line in FIG. 11), or until the base end sides of the probe pins 70 peeled off the connection terminals 13. Then, it was checked for each of the prototypes whether or not the probe pin 70 peeled off the connection terminal 13, and bonding forces between the probe pins 70 and the connection terminals 13 were compared. Results of the experiment are shown in Table 1, the magnitude of the bonding force is given as a ratio to a certain reference value which is defined as 1 (this also applies to Table 2 to follow). As shown in Table 1, among the 46 prototypes, the peeling of the probe pin 70 off the connection terminal 13 occurred in three of the prototypes. That is, an occurrence rate of the peeling was about 6.5[%]. Further, as for the bonding force of the 46 prototypes, the minimum value (Min) was 13, the maximum value (Max) was 21, an average value (Ave) was about 19.8, and 3σ (σ: standard deviation) was about 4.1.

TABLE 1

| prototype No. | bonding force | peeling |
|---|---|---|
| 1 | 13 | occurred |
| 2 | 19 | |
| 3 | 19 | |
| 4 | 19 | |
| 5 | 19 | |
| 6 | 18 | |
| 7 | 20 | |
| 8 | 19 | |
| 9 | 19 | |
| 10 | 19 | |
| 11 | 21 | |
| 12 | 20 | |
| 13 | 20 | |
| 14 | 20 | |
| 15 | 20 | |
| 16 | 21 | occurred |
| 17 | 20 | |
| 18 | 20 | |
| 19 | 20 | |
| 20 | 20 | |
| 21 | 20 | |
| 22 | 20 | |
| 23 | 19 | |
| 24 | 20 | |
| 25 | 20 | |
| 26 | 21 | |
| 27 | 20 | |
| 28 | 20 | |
| 29 | 20 | |
| 30 | 21 | |
| 31 | 20 | |
| 32 | 21 | |
| 33 | 20 | |
| 34 | 20 | |
| 35 | 16 | occurred |
| 36 | 20 | |
| 37 | 21 | |
| 38 | 20 | |
| 39 | 21 | |
| 40 | 20 | |
| 41 | 20 | |
| 42 | 21 | |
| 43 | 21 | |
| 44 | 20 | |
| 45 | 21 | |
| 46 | 20 | |
| number of peeling occurrences | 3 | |
| peeling occurrence rate [%] | 6.5 | |
| bonding force Min | 13 | |
| bonding force Max | 21 | |
| bonding force Ave | 19.76087 | |
| bonding force 3σ | 4.107787 | |

Experiment 2

By using a conventional bonding apparatus, 46 prototypes were fabricated, each structured such that a probe pin 70 and a connection terminal 13 were bonded together. In the same manner as in the experiment 1, for each of the prototypes, an experiment to examine a bonding force was conducted by pressing a tip of the probe pin 70 in a state where the probe pin 70 was positioned on an upper side of the connection terminal 13. Results of the experiment are shown in Table 2. As shown in Table 2, among the 46 prototypes, the peeling of the probe pin 70 occurred in 43 of the prototypes. That is, an occurrence rate of the peeling was about 93.5 [%]. Further, as for the bonding force when the maximum load was applied to the 46 prototypes, the minimum value (Min) was about 0, the maximum value (Max) was 19, an average value (Ave) was about 9.5, and 3σ was about 15.0.

TABLE 2

| prototype No. | bonding force | peeling |
|---|---|---|
| 1 | 4 | occurred |
| 2 | 6 | occurred |
| 3 | 13 | occurred |
| 4 | 0 | occurred |
| 5 | 12 | occurred |
| 6 | 5 | occurred |
| 7 | 5 | occurred |
| 8 | 10 | occurred |
| 9 | 12 | occurred |
| 10 | 0 | occurred |
| 11 | 12 | occurred |
| 12 | 4 | occurred |
| 13 | 12 | occurred |
| 14 | 12 | occurred |
| 15 | 1 | occurred |
| 16 | 15 | occurred |
| 17 | 9 | occurred |
| 18 | 7 | occurred |
| 19 | 16 | occurred |
| 20 | 4 | occurred |
| 21 | 13 | occurred |
| 22 | 2 | occurred |
| 23 | 13 | occurred |
| 24 | 13 | occurred |
| 25 | 13 | occurred |
| 26 | 9 | occurred |
| 27 | 8 | occurred |
| 28 | 12 | occurred |
| 29 | 5 | occurred |
| 30 | 4 | occurred |
| 31 | 0 | occurred |
| 32 | 11 | occurred |
| 33 | 5 | occurred |
| 34 | 10 | occurred |
| 35 | 19 | |
| 36 | 19 | |
| 37 | 7 | occurred |
| 38 | 10 | occurred |
| 39 | 12 | occurred |
| 40 | 13 | occurred |
| 41 | 17 | |
| 42 | 12 | occurred |
| 43 | 13 | occurred |
| 44 | 10 | occurred |
| 45 | 13 | occurred |
| 46 | 16 | occurred |
| number of peeling occurrences | 43 | |
| peeling occurrence rate [%] | 93.5 | |
| bonding force Min | 0 | |
| bonding force Max | 19 | |
| bonding force Ave | 9.521739 | |
| bonding force 3σ | 15.04313 | |

From the above results of the experiments 1, 2, it has been confirmed that, as compared with the use of the conventional bonding apparatus for the bonding, the use of the bonding apparatus 30 according to the embodiment for the bonding can make the probe pin 70 more difficult to peel off the connection terminal 13, and can maintain a state where they are bonded against a larger force even when the force is applied to the tip portion of the probe pin 70. Therefore, it has been confirmed that the use of the bonding apparatus 30 can improve the bonding force.

Further, the present inventors conducted the following experiments 3, 4 in order to compare positional accuracy (a degree of positional deviation of the probe pin 10 from a proper bonding position relative to the connection terminal 13) when the bonding apparatus 30 described in the embodiment is used to bond the probe pin 10 and the connection terminal 13, with positional accuracy when the conventional bonding apparatus is used to bond the probe pin 10 and the connection terminal 13.

Experiment 3

By using the bonding apparatus 30, 48 prototypes were fabricated, each structured such that the probe pin 10 and the connection terminal 13 were bonded together. Then, for each of the prototypes, deviation of the probe pin 10 from a proper position (positional deviation) relative to the connection terminal 13 was measured in a width direction (X-axis direction) and a length direction (Y-axis direction) of the probe pin 10. To measure the positional deviation, an image recognition technique was applied. Results of the measurement are shown in Table 3. In Table 3, the degree of the positional deviation is given as a ratio to a certain reference value which is defined as 1 (the same applies to Table 4 to follow). As shown in Table 3, an average value (Ave) of the positional deviation in the X-axis direction was about 4.6, and an average value of the positional deviation in the Y-axis direction was about 48.9. Further, 3σ of the positional deviation in the X-axis direction was about 7.4 and 3σ of the positional deviation in the Y-axis direction was about 31.1.

TABLE 3

| prototype No. | positional deviation | |
|---|---|---|
| | X axis | Y axis |
| 1 | 4 | 41 |
| 2 | 2 | 41 |
| 3 | −2 | 29 |
| 4 | 5 | 23 |
| 5 | 1 | 25 |
| 6 | 4 | 43 |
| 7 | 4 | 51 |
| 8 | 4 | 39 |
| 9 | 3 | 39 |
| 10 | 7 | 57 |
| 11 | 7 | 54 |
| 12 | 7 | 50 |
| 13 | 8 | 51 |
| 14 | 5 | 52 |
| 15 | 6 | 56 |
| 16 | 7 | 43 |
| 17 | 4 | 60 |
| 18 | 4 | 63 |
| 19 | 5 | 50 |
| 20 | 5 | 64 |
| 21 | 2 | 24 |
| 22 | 2 | 34 |
| 23 | 6 | 51 |
| 24 | 7 | 50 |
| 25 | 8 | 47 |
| 26 | 2 | 35 |
| 27 | 4 | 45 |
| 28 | 9 | 55 |
| 29 | 4 | 58 |
| 30 | 3 | 56 |
| 31 | 8 | 55 |
| 32 | 5 | 49 |
| 33 | 2 | 60 |
| 34 | 2 | 49 |
| 35 | 1 | 50 |
| 36 | 1 | 61 |
| 37 | 3 | 67 |
| 38 | 3 | 44 |
| 39 | 7 | 52 |
| 40 | 5 | 55 |
| 41 | 8 | 41 |
| 42 | 2 | 56 |
| 43 | 4 | 51 |
| 44 | 8 | 46 |
| 45 | 8 | 51 |
| 46 | 6 | 59 |
| 47 | 8 | 55 |
| 48 | 5 | 59 |
| Min | −2 | 23 |
| Max | 9 | 67 |
| Avg | 4.6 | 48.9 |
| 3σ | 7.4 | 31.1 |

Experiment 4

By using the conventional bonding apparatus, 48 prototypes were fabricated, each structure such that the probe pin 10 and the connection terminal 13 were bonded together. Then, for each of the prototypes, positional deviation of the probe pin 10 from the connection terminal 13 was measured in the X-axis direction and the Y-axis direction, in the same manner as in the experiment 3. To measure the positional deviation, an image recognition technique was applied. Results of the measurement are shown in Table 4. As shown in Table 4, an average value (Ave) of the positional deviation in the X-axis direction was about 8.3, and an average value of the positional deviation in the Y-axis direction was about 51.3. Further, 3σ of the positional deviation in the X-axis direction was about 27.7 and 3σ of the positional deviation in the Y-axis direction was about 146.8.

TABLE 4

| prototype No. | positional deviation | |
|---|---|---|
| | X axis | Y axis |
| 1 | 22 | 38 |
| 2 | 2 | 38 |
| 3 | 2 | 56 |
| 4 | 3 | 112 |
| 5 | 22 | 90 |
| 6 | −8 | 31 |
| 7 | 25 | 93 |
| 8 | 17 | 103 |
| 9 | 8 | 27 |
| 10 | 11 | 49 |
| 11 | 15 | 31 |
| 12 | 6 | 20 |
| 13 | 8 | 41 |
| 14 | 20 | 88 |
| 15 | 11 | 74 |
| 16 | 11 | −76 |
| 17 | 11 | 69 |
| 18 | 2 | 65 |
| 19 | 2 | 33 |
| 20 | 1 | 26 |
| 21 | 2 | 6 |
| 22 | 7 | 33 |
| 23 | 20 | 126 |
| 24 | 4 | 22 |

TABLE 4-continued

| prototype No. | positional deviation | |
|---|---|---|
| | X axis | Y axis |
| 25 | 2 | 37 |
| 26 | 4 | 148 |
| 27 | 24 | 41 |
| 28 | 9 | 31 |
| 29 | 2 | 33 |
| 30 | 10 | −13 |
| 31 | −2 | 73 |
| 32 | −2 | 30 |
| 33 | 13 | 166 |
| 34 | −6 | −84 |
| 35 | −4 | 6 |
| 36 | 16 | 9 |
| 37 | 13 | 23 |
| 38 | 9 | 116 |
| 39 | −6 | 44 |
| 40 | 3 | 60 |
| 41 | 16 | 103 |
| 42 | 16 | 64 |
| 43 | 35 | 107 |
| 44 | 9 | 50 |
| 45 | −4 | 60 |
| 46 | 12 | 27 |
| 47 | −2 | 2 |
| 48 | 5 | 134 |
| Min | −8 | −84 |
| Max | 35 | 166 |
| Avg | 8.3 | 51.3 |
| 3σ | 27.7 | 146.8 |

From the above results of the experiments 3, 4, it has been found that, as compared to the use of the conventional bonding apparatus for the bonding, the use of the bonding apparatus 30 for the bonding can reduce the degree of the positional deviation, and can reduce 3σ both in the X-axis direction and the Y-axis direction to about ⅓ or smaller and thus reduce variation in the positional deviation. Therefore, it has been confirmed that the use of the bonding apparatus 30 effectively improves positional accuracy of the bonding.

What is claimed is:

1. A bonding apparatus which bonds a first object to be bonded and a second object to be bonded by bringing a bonding member into contact with an upper surface of the second object to be bonded placed on an upper surface of the first object to be bonded and ultrasonically vibrating the second object to be bonded by said bonding member,
wherein said bonding member has a contact portion which is brought into contact with the second object to be bonded and a holding portion which holds the second object to be bonded,
wherein said bonding member has an unleveled portion engaged with an unleveled portion provided in the second object to be bonded,
wherein the unleveled portion of said bonding member constitutes the contact portion and the holding portion,
wherein the first object to be bonded is an electrode provided on a surface facing an inspection object, in a probe card inspecting an electric characteristic of the inspection object,
wherein the second object to be bonded is a probe pin brought into contact with the inspection object, in the probe card,
wherein the unleveled portion of said bonding member is composed of a flat plane provided in a tip portion of said bonding member and a projecting portion projecting from the flat plane immediately adjacent to the unleveled portion,
wherein the flat plane is the contact portion, and
wherein the projecting portion is the holding portion.

2. The bonding apparatus according to claim 1, wherein the projecting portion is provided on a center portion of the flat plane.

3. The bonding apparatus according to claim 1, wherein the projecting portion is provided in plurality.

4. The bonding apparatus according to claim 1, wherein the unleveled portion of said bonding member is composed of a flat plane provided in a tip portion of said bonding member and a recessed portion provided in the flat plane,
wherein the flat plane is the contact portion, and
wherein the recessed portion is the holding portion.

5. The bonding apparatus according to claim 4, wherein the recessed portion is provided in a center portion of the flat plane.

6. The bonding apparatus according to claim 4, wherein the recessed portion is provided in plurality.

7. The bonding apparatus according to claim 1, wherein projection and recession of the unleveled portion of said bonding member are arranged alternately along a vibration direction of the ultrasonic vibration of said bonding member.

* * * * *